United States Patent
Courcy

(10) Patent No.: US 8,160,117 B1
(45) Date of Patent: Apr. 17, 2012

(54) LINE RATE SPREAD SPECTRUM CLOCK GENERATOR FOR USE IN LINE IMAGING SYSTEMS

(75) Inventor: Matthew Courcy, Fremont, NH (US)

(73) Assignee: Texas Instruments Incorporated, Dallas, TX (US)

(*) Notice: Subject to any disclaimer, the term of this patent is extended or adjusted under 35 U.S.C. 154(b) by 1044 days.

(21) Appl. No.: 12/099,672

(22) Filed: Apr. 8, 2008

(51) Int. Cl.
  H04B 1/69 (2011.01)
  H04L 7/00 (2006.01)
  H03D 3/24 (2006.01)
  H03L 7/06 (2006.01)

(52) U.S. Cl. ........ 375/130; 375/354; 375/355; 375/376; 348/537

(58) Field of Classification Search ............ 375/354, 375/355, 371–376, 130, 140
See application file for complete search history.

(56) References Cited

U.S. PATENT DOCUMENTS

| | | | |
|---|---|---|---|
| 5,757,338 A | 5/1998 | Bassetti et al. | |
| 6,665,019 B1 | 12/2003 | Pronkine | |
| 2006/0176525 A1* | 8/2006 | Mizuta et al. | 358/474 |
| 2007/0120989 A1* | 5/2007 | Minami et al. | 348/266 |
| 2009/0059324 A1* | 3/2009 | Nagase et al. | 358/513 |
| 2010/0080264 A1* | 4/2010 | Yokochi | 375/130 |
| 2011/0062994 A1* | 3/2011 | Kusunoki | 327/48 |

* cited by examiner

Primary Examiner — Tesfaldet Bocure
(74) Attorney, Agent, or Firm — Andrew S. Viger; Wade J. Brady, III; Frederick J. Telecky, Jr.

(57) ABSTRACT

A method of generating a spread spectrum clock signal for a line imaging device including receiving a line length value of the line imaging device, receiving a first clock signal indicative of a system timing signal in the line imaging device, generating a spreading waveform having a frequency as a function of the line length value and having a total number of clock cycles matching the line length value, and modulating the first clock signal using said spreading waveform to generate the spread spectrum clock signal where the spread spectrum clock signal is used for driving the imaging, data sampling and digitizing, and data transfer operation of the line imaging device. The spread spectrum clock has the same clock frequency variation for each scan line of the line imaging device.

12 Claims, 8 Drawing Sheets

LINE RATE SPREAD SPECTRUM CLOCK GENERATOR FOR USE IN LINE IMAGING SYSTEMS

CROSS-REFERENCE TO RELATED APPLICATIONS

This application is related to the following commonly assigned and concurrently filed U.S. patent application Ser. No. 12/099,666, entitled "Mixed Domain Spread Spectrum Clocking For Use In Imaging Systems For Maximum Imaging Quality And Optimized EMI Performance," of Matthew Courcy et al., which patent application is incorporated herein by reference in its entirety.

FIELD OF THE INVENTION

The invention relates to spread spectrum clock generators and, in particular, to a spread spectrum clock generator for use in a line imaging system that reduces electromagnetic interference (EMI) while avoiding image degradation.

DESCRIPTION OF THE RELATED ART

Spreading clocking spectrum is a common technique used in consumer electronics for reducing electromagnetic interference (EMI) below a regulated level. In clocked systems, especially those with a large number of conductive traces containing energy based on the clock, a large amount of EMI may be generated around the clock frequency. Techniques for reducing EMI are known, including using differential signaling. Spread spectrum clocking scheme is another method employed for reducing EMI in clocked electronic systems.

In spread spectrum clocking, the clock frequency is modulated in order to reduce the signal power associated with the clock and clock based signals by spreading the number of frequencies the power exists at in a given period of time. FIG. 1(a) illustrates a power spectrum 1 for a system with a clock at a clock frequency $f_0$ superimposed with a power spectrum 2 for a system where the clock frequency is modulated using spread spectrum clocking. FIG. 1(b) illustrates the variation of the frequency of the spread spectrum clock signal between frequencies $+/- \Delta f$ about the center frequency $f_0$. In FIG. 1(b), a triangle waveform for spreading the clock frequency is used. As shown in FIG. 1(a), in a system where the clock is unmodulated, the radiation appears as a narrow spike (power spectrum 1) around the clock frequency. The amplitude of radiation often exceeds the FCC regulated level. However, when spread spectrum clocking is applied to modulate the clock frequency over a given range, the intensity of the radiation (power spectrum 2) at any given clock frequency is lowered and a table-top profile results. Thus, even though the total energy from all the clock frequencies is the same as the total energy of the un-modulated clock case, the maximum radiation level is reduced so that the system emits EMI well below the regulated level.

Imaging systems use clocks to acquire images and to transfer digital data between the data processing blocks within the imaging system. While spread spectrum clocking scheme can be advantageously applied in imaging systems to reduce EMI, the use of spread spectrum clocks also has undesirable effects, often degrading image quality. In particular, it has been recognized that the use of spread spectrum clocks in line CCD imaging devices, such as digital copiers and scanners, causes image degradation. Image degradation occurs due to variation in exposure time and variation in processing time of the analog-to-digital conversion circuitry due to the spreading of the clock frequency.

A line CCD imaging device (also referred to as a line CCD imager) includes a CCD sensor array which is a linear array of photo-sensitive diodes. The CCD array is scanned across an area of interest to acquire a digital image of the area line by line. FIG. 2 is a block diagram of a conventional line CCD imaging device. A conventional line CCD imaging device is typically made up of a movable sensor bar 12 and a fixed image processor board 14. The movable sensor bar 12 houses the CCD sensor array 18, a light source (lamp 22) and an analog front end (AFE) circuit 20. In imaging systems, the analog front end (AFE) circuit 20 includes an analog sampling circuit, an analog-to-digital converter circuit and also timing and control circuitry for the sensor array and the light source. In operation, movable sensor bar 12 is moved by a motor to scan the CCD sensor array 18 across the imaging area of interest. CCD sensor array 18 captures analog data signals indicative of a line image and the analog data is digitized at the AFE circuit 20 into digital pixel data.

The image sensor board typically remains affixed in the imaging system and includes, among other things, an image processor integrated circuit (IC) 24 for receiving the digital pixel data from the AFE circuit 20 and processing the digital pixel data for output to a host system. The movable sensor bar 12 communicates with the image processor board 14 through a cable 16. Typically, the image processor board 14 provides the clock signal (CLK) and the control data to the movable sensor bar 12, such as through a serial peripheral interface (SPI), via cable 16 and the movable sensor bar 12 provides the digital pixel data to the image processor integrated circuit 24 also via cable 16. The clock signal received on the movable sensor bar 12 from cable 16 is provided to the AFE circuit 20 which distributes the timing signals for driving the CCD sensor array 18 and the lamp 22.

In conventional imaging systems, when spread spectrum clocking scheme is applied, the clock signal for the entire imaging system is spread. For example, in the line CCD imaging system of FIG. 2, a spread spectrum clock generator 26 is included on the image processor board 14 which receives the source clock signal and generates a spread spectrum clock for the entire line imaging system. Thus, the clock signals driving the image processor IC 24 and the AFE circuit 20 are spread to have variations in clock frequencies. Furthermore, AFE circuit 20 generates timing signals for the CCD sensor array 18 using the spread spectrum clock. When the exposure clock of the CCD sensor array 18 and the sampling clock of the AFE circuit 20 vary with frequencies, image quality degradation may result.

In operation, during the exposure time of each line, the photo-diodes of the CCD array is exposed during substantially the entire length of the line. Thus, it can be assumed that the CCD sensor array acquires images by exposure to the object for the entire line exposure time. As is well understood, the brightness of the acquired image is directly proportional to the length of the exposure time. Thus, if the exposure time varies by a certain percentage, the brightness of the line will also vary accordingly. When spread spectrum clocking is used, the exposure time for each successive line could start and stop at different clock frequencies of the clock spread, leading to different line exposure times for the line images.

Referring to FIG. 1(b), when spread spectrum clocking is used, a line 1 scan spans a section of the spread spectrum clock while another line 2 spans a different section of the spread spectrum clock. The variation in the clock frequencies is such that the line exposure time for line 1 is different than the line exposure time for line 2. More specifically, the line exposure time for the first line occurs when the system clock is mostly running faster than $f_0$ while the line exposure time for the second line occurs when the system clock is mostly running slower than $f_0$. Thus, the exposure time for the first line will be shorter than the exposure time for the second line, causing a line to line variation in light intensity. The two lines can vary in brightness by 2% due to the spread spectrum clock. A 2% variation in brightness is visible to the human eye as a spreading artifact.

Another effect of spread spectrum clocking in imaging systems is transfer efficiency from the CCD sensor to the analog front end (AFE) circuitry. After the exposure of each line, the line pixel data are shifted out of the CCD sensor array 18 to the AFE circuit 20 which will digitize and process the data. Because of the spread spectrum clock, the sampling and digitizing of the CCD sensor output data occur at different times during the settling of the signal level and can appear as intensity variations. For example, the reset time and the sample time of the analog-to-digital conversion circuits may vary to affect the accuracy of the digitized data.

In sum, while the use of spread spectrum clocking scheme is often necessary for reducing EMI, spread spectrum clocking scheme used in imaging systems often leads to undesirable image degradation.

BRIEF DESCRIPTION OF THE DRAWINGS

FIG. 1(*b*) illustrates the variation of the frequency of the spread spectrum clock signal.

DETAILED DESCRIPTION OF THE PREFERRED EMBODIMENTS

Line Rate Spread Spectrum Clock Generation

In accordance with the principles of the present invention, a line rate spread spectrum clock generator for a line imaging device links the rate of the spread spectrum clock generator to the line rate of the line imaging device. In this manner, the exposure time of the line imaging device is constant from line to line and image degradation caused by line-to-line intensity variation is obviated. Furthermore, the spread spectrum clock and line rate linkage ensures that errors created by the clock spectrum spreading are made consistent and repeatable from line to line, allowing for easier compensation of these errors. Accordingly, the line rate spread spectrum clock generator can be applied in a line imaging device for reducing EMI while avoiding undesirable image degradation.

In particular, the line rate spread spectrum clock generator of the present invention generates a spread spectrum clock signal that is made to be synchronous with the line rate of the line imaging device. Accordingly, the frequency variation of the clock between the beginning and end of a scan line will always be consistent. The exposure time of each scan line will thus be the same. In this manner, spread spectrum clocking can be applied to reduce EMI without causing image degradation.

In the present description, a line imaging device or a line imager refers to an imaging device or an imaging system including a linear sensor array where an image of an area of interest is obtained line by line by scanning the linear sensor array across the area of interest. A line imaging device can include a CCD sensor array or other types of photosensitive imaging array for capturing the light intensity level of the imaging area of interest. In the following description, a line CCD imaging device is used to illustrate the line rate spread spectrum clocking scheme of the present invention. However, the line rate spread spectrum clocking scheme of the present invention can be applied to any line imaging device using either CCD sensors or other types of photosensors.

Figure 3:
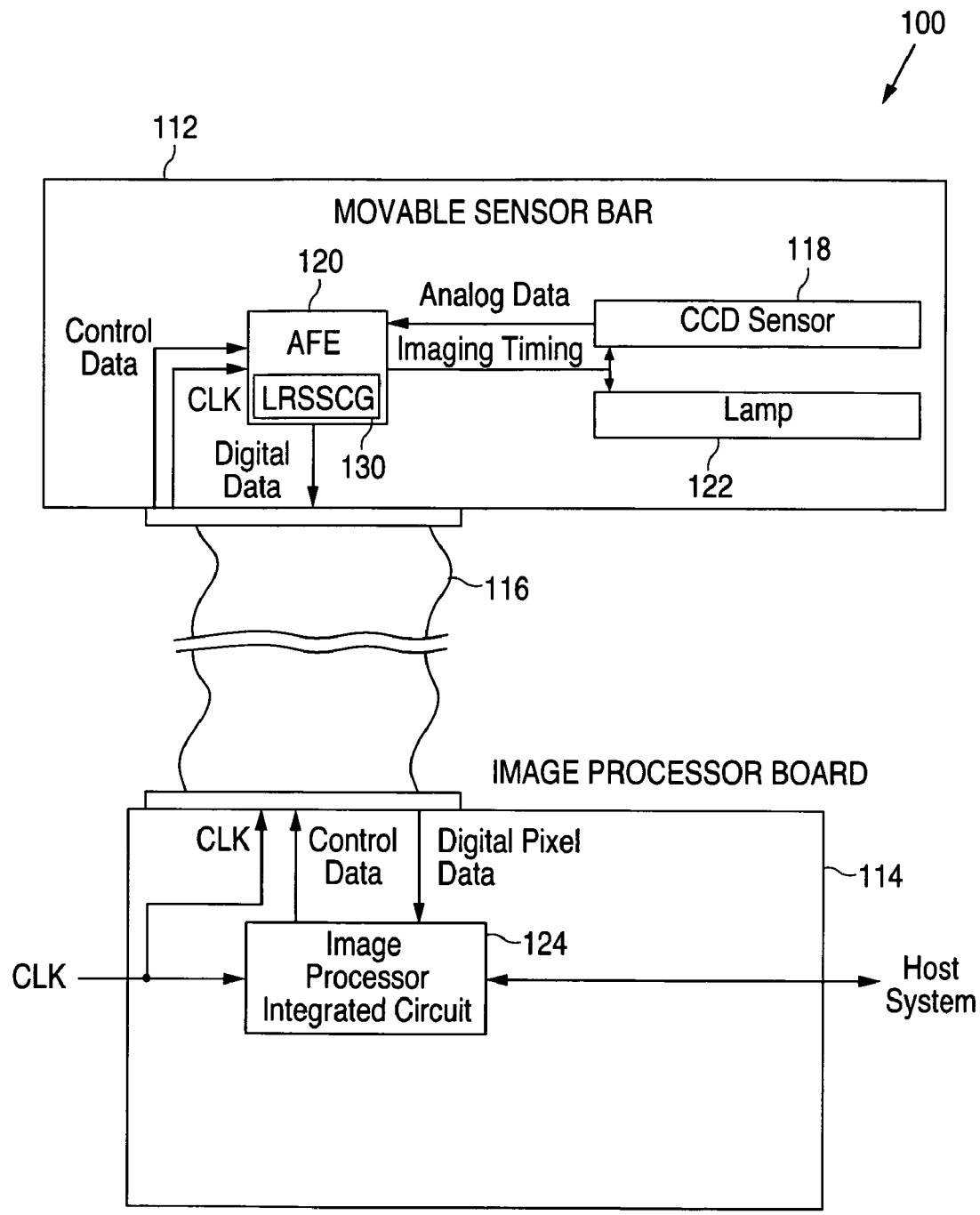
FIG. 3 is a block diagram of a line CCD imaging device according to one embodiment of the present invention.

FIG. 3 is a block diagram of a line CCD imaging device according to one embodiment of the present invention. Referring to FIG. 3, line CCD imaging device 100 includes a movable sensor bar 112 for housing an analog front end (AFE) circuit 120, a CCD sensor array 118, and a lamp 122. AFE circuit 120 includes, among other things, an analog-to-digital converter circuit and also timing and control circuitry for the sensor array and the light source. Line CCD imaging device 100 further includes a fixed image processor board 114 housing an image processor integrated circuit 124. Movable sensor bar 112 and image processor board 114 communicate over a cable 116. In operation, image processor board 114 provides the clock signal (CLK) and the control data to the movable sensor bar 112 via cable 116 and movable sensor bar 112 provides the digital pixel data to the image processor integrated circuit 124 also via cable 116. The clock signal received on the movable sensor bar 112 from cable 116 is provided to the AFE circuit 120 which distributes the timing signals for driving the CCD sensor array 118 and the lamp 122. In one embodiment, the clock and control signals from image processor board 114 is communicated to movable sensor bar 112 using a serial peripheral interface (SPI). However, the use of SPI for transferring of clock and control signals is illustrative only and is not intended to be limiting.

In accordance with the present invention, spread spectrum clocking scheme is applied to line CCD imaging device 100 by spreading the frequency of the clock signal at the movable sensor bar. In particular, a line rate spread spectrum clock generator 130 is provided on movable sensor bar 112 for receiving the unmodulated clock signal CLK on cable 16 and generating a clock signal with modulated clock frequencies, referred herein as the spread spectrum clock signal "ssCLK". In the present embodiment, the line rate spread spectrum clock generator 130 is incorporated in the AFE circuit 120. More specifically, in the present embodiment, the line rate spread spectrum clock generator 130 is integrated onto the same integrated circuit of the AFE circuit 120. The integration of the line rate spread spectrum clock generator 130 into the AFE circuit 120 simplifies the design of the movable sensor bar. However, in other embodiments, the line rate spread spectrum clock generator 130 can be formed outside of the AFE circuit as a separate integrated circuit mounted on the movable sensor bar. The exact level of integration of the line rate spread spectrum clock generator is not critical to the practice of the present invention.

In the present embodiment, AFE circuit 120, incorporating the line rate spread spectrum clock generator 130, uses the spread spectrum clock ssCLK to generate timing signals for the CCD sensor array 118 and the lamp 122. AFE circuit 120 also uses the spread spectrum clock ssCLK for sampling and digitizing the analog pixel data received from the CCD sensor array 118. Finally, AFE circuit 120 uses the spread spectrum clock for transferring the digital pixel data across cable 116 back to image processor board 114. To eliminate image degradation that can result from the use of spread spectrum clock signals during image capture and data sampling, line rate spread spectrum clock generator 130 generates the spread spectrum clock signal by linking the variation of the clock frequency to the line rate of the line imaging device. In this manner, while the imaging, sampling and data out timing are spread for EMI reduction, the clock frequency variation is the same for each line so that line-to-line variations in exposure and sampling time are eliminated. In conventional imaging systems, because the spread spectrum clock signal is generated at the system level, such as at the image processor board, the line rate of the line imaging device is typically asynchronous to the clock spread rate and line-to-line image intensity variations result. However, in accordance with the present invention, the spread spectrum clock by linking the clock spreading to the line rate to eliminate variations in exposure and sampling time from scan line to scan line.

Figure 4:
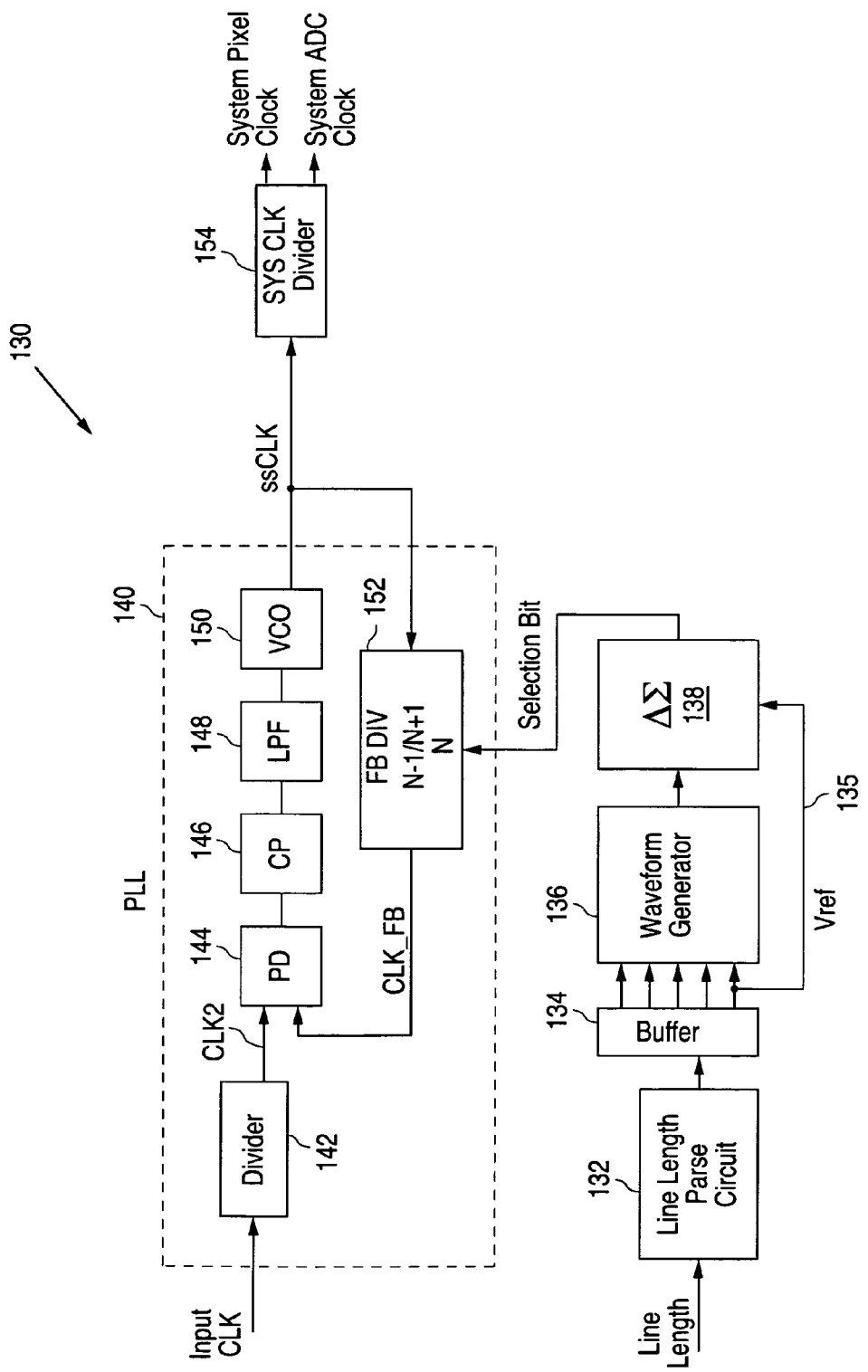
FIG. 4 is a schematic diagram of a line rate spread spectrum clock generator which can be incorporated in the line CCD imaging device of FIG. 3 according to one embodiment of the present invention.

FIG. 4 is a schematic diagram of a line rate spread spectrum clock generator according to one embodiment of the present invention. Referring to FIG. 4, line rate spread spectrum clock generator 130 (hereinafter "LRSSCG 130") receives as input signals the input clock signal CLK and a signal indicative of the line length of the line imaging device. LRSSCG 130 generates a spread spectrum clock signal ssCLK which can be coupled to a system clock divider 154 for generating the system pixel clock for driving the imaging sensor and the system ADC clock for driving the sampling and digitizing operations. The system ADC clock is also used to output the digital pixel data onto cable 116. The system pixel clock and the system ADC clock are therefore spread spectrum clocks of either the same or different clock frequencies.

For each imaging device, the user has apriori knowledge of the length of the scan line being used. In one embodiment, the line length, the sample rate of the analog-to-digital converter in AFE circuit 120, and the clock spreading percentage are programmable parameters that are programmed into AFE circuit 120. The clock spreading factor can be expressed as a spread percentage $\Delta f$ about the basic clock frequency $f_0$. Thus, the frequency variation of ssCLK is given as $f_0 \pm \Delta f$. In one embodiment, the clock spread percentage has a value selected from 0.625%, 1.25%, 2.5% and 5%. LRSSCG 130 operates to match the spreading frequency to the line rate or some multiple of the line rate. As a result, each line will always begin at the same frequency relative to the spectrum spread. The exposure and sampling time will always be the same for each line so that line-to-line image effects are obviated.

Figure 5:
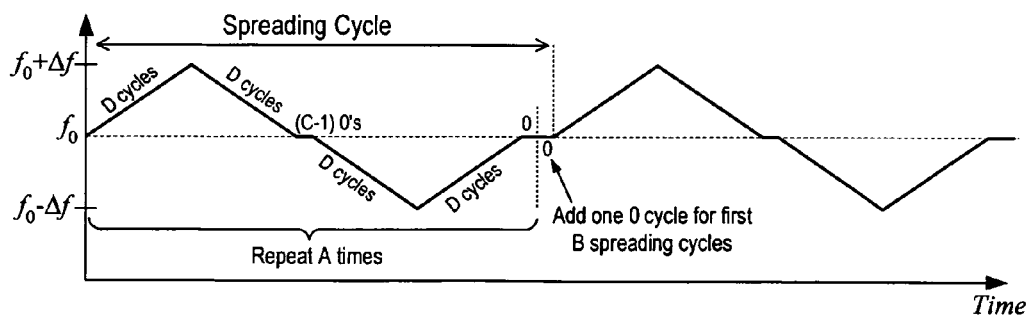
FIG. 5 illustrates the variation of the frequency of the spread spectrum clock signal generated using the line rate spread spectrum clock generator according to one embodiment of the present invention.
Figure 2:
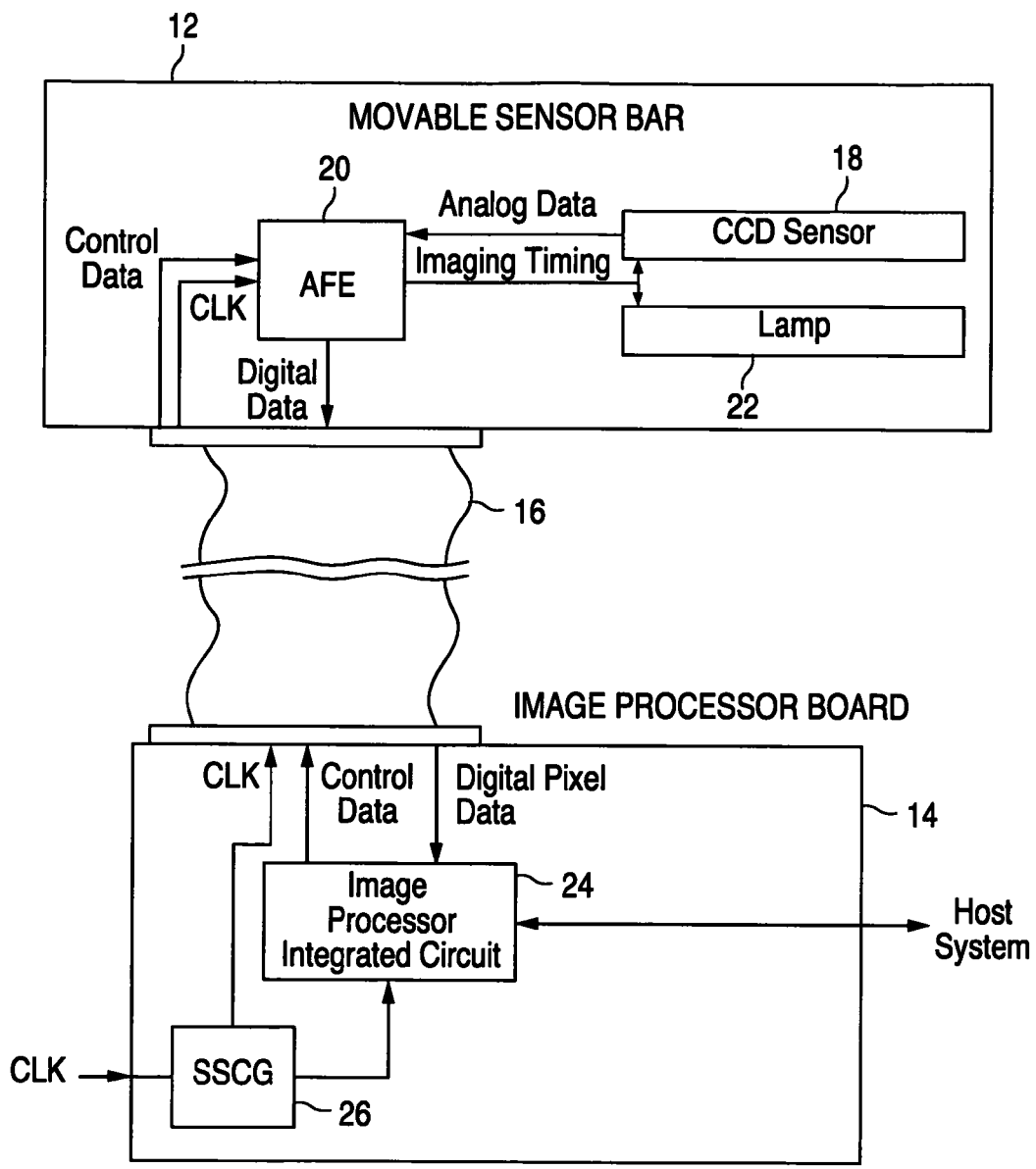
FIG. 2 is a block diagram of a conventional line CCD imaging device.

In the present embodiment, LRSSCG 130 includes a line length parse circuit 132 for receiving the line length input signal and parsing the line length into a set of spreading waveform parameters for forming a spreading waveform. In the present description, "parsing the line length" describes the process of breaking down the line length number into waveform parameter values for defining the shape of the spreading waveform. The line length parse circuit 132 generates waveform shape values which are stored in a buffer 134 and provided to a waveform generator 136. Waveform generator 136 generates a spreading waveform based on the waveform shape values stored in buffer 134. The spreading waveform is formed so that the frequency variation matches the line length exactly. In the present embodiment, the spreading waveform is a triangle wave of variable frequency and amplitude and includes zero padding for matching the line length exactly, as shown in FIG. 5. A triangle waveform has particular advantage in EMI reduction as it provides a flattened tabletop profile for the frequency spectrum, such as spectrum 2 in FIG. 1(*a*). In other embodiments, other waveform shapes, such as a sine wave, can also be used as the spreading waveform. A sine wave spreading waveform provides a frequency spectrum that has a cup shape and thus may have a slightly elevated EMI around the center frequency.

In one embodiment, the spreading waveform includes an integer number of spreading cycles per line so that the clock spread is made to be line synchronous. In the present description, the "spreading cycle" refers to one period of the modulating waveform, such as one period of the triangle waveform. Within a spreading cycle, the clock frequency is caused to modulate between the full range of the selected spread percentage, that is, the frequency variation of the spread spectrum clock within a spreading cycle CLK is $f_0 \pm \Delta f$.

The spreading waveform generated by waveform generator 136 is coupled to a scalable reference digital delta-sigma ($\Delta\Sigma$) modulator 138 (hereinafter "modulator 138"). Modulator 138 generates a one's density bit stream indicative of the average value of the triangular spreading waveform. The one's density bit stream has a maximum value and a minimum value at the maximum and minimum of the clock frequency spreading range. More specifically, the oversampling capability of the delta-sigma modulator is exploited to translate the large scale spreading waveform into a one's density single bit waveform.

Modulator 138 operates based on the same reference voltage Vref (node 135) used by waveform generator 136. Thus, by using the same reference voltage Vref for waveform generator 136 and modulator 138, modulator 138 can track the amplitude of the spreading waveform to maintain a constant spread percentage. The one's (1's) density bit stream generated by modulator 138 is a selection bit used to control a feedback frequency divider 152 in a phase-locked loop (PLL) 140. In operation, the selection bit modulates the divider ratio in the PLL feedback path so as to modulate the frequency of the clock signal.

LRSSCG 130 includes PLL 140 for receiving the input clock signal CLK which is the unmodulated clock signal. The clock signal CLK may be coupled to a divider 142 to divide down the clock frequency where needed. Divider 142 is optional. The divided-down clock CLK2 is coupled to a phase detector 144. Phase detector 144 also receives a feedback clock signal CLK_FB from feedback frequency divider 152 placed in a negative feedback path in PLL 140. Phase detector 144 compares the phase difference between clock signals CLK2 and CLK_FB. The phase difference is provided to a charge pump 146 and then to a low-pass filter 148. The output signal of low-pass filter 148 is coupled to drive a voltage-controlled oscillator (VCO) 150 which generates an output clock signal being the spread spectrum clock signal ssCLK. The output clock signal from VCO 150 is fed back to feedback frequency divider 152 in the feedback path to generate the feedback clock signal CLK_FB.

The operation of PLL 140 is well known. PLL 140 generates an output clock signal that has a fixed relation to the phase of the input clock signal. Assuming that feedback frequency divider 152 has a fixed divider value, VCO 150 is controlled by the phase difference between the input clock CLK and the feedback clock CLK_FB to generate an output clock signal having the fixed relation to the phase of the input clock CLK. The frequency divider 152 in the feedback path and the frequency divider 142 in the input clock path, if any, are included to make the PLL's output signal frequency an integer multiple of the input clock frequency.

In the present embodiment, feedback frequency divider 152 is modulated by the selection bit generated by modulator 138. The selection bit is a one's density bit stream representative of the triangle waveform and varies the frequency divider ratio about a center value of N. In one embodiment, the frequency divider ratio is varied from a value of N−1 to N+1 based on the selection bit. In this manner, the feedback clock signal CLK_FB is modulated so that VCO 150 generates an output clock being a spread spectrum clock ssCLK whose frequency spread between a frequency range defined by the selected spread percentage. The power spectrum of the spread spectrum ssCLK is centered at the frequency of the input clock ($f_0$) and has a tabletop profile, same as spectrum 2 in FIG. 1(*a*).

Figure 1A:
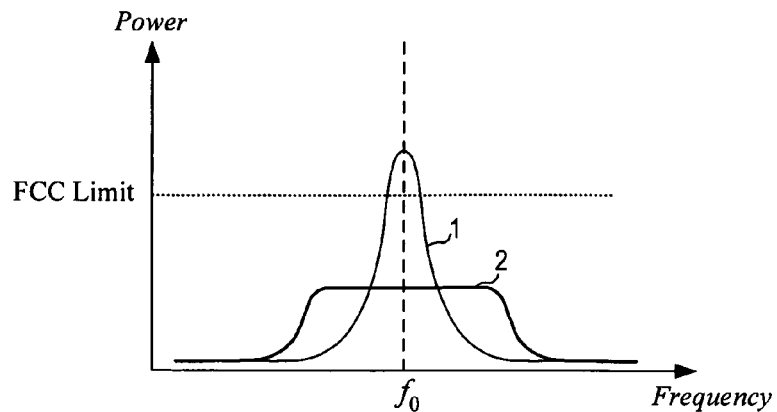
FIG. 1(*a*) illustrates the power spectrum of a system clock at a single clock frequency and the power spectrum of a system clock modulated with a spread spectrum clocking scheme.
Figure 1B:
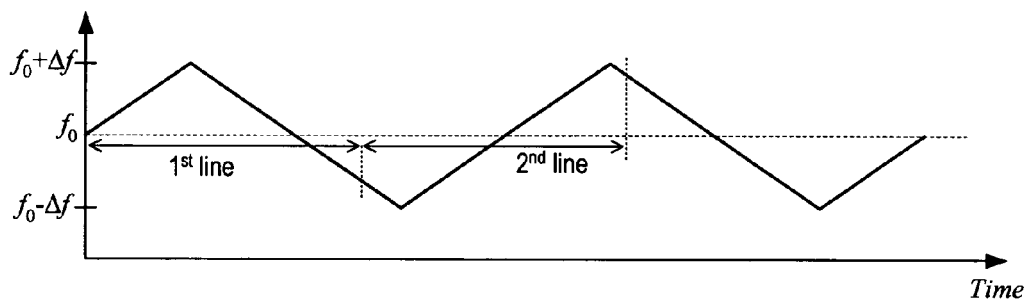

For example, when the one's density bit stream forming the selection bit is all 1's the feedback divider ratio will be set to N+1 and the PLL output clock frequency will be at the maximum spread frequency. Alternately, when the one's density bit stream forming the selection bit is all 0's, the feedback divider ratio will be set to N−1 and the PLL output clock frequency will be at the minimum spread frequency. With a triangle spreading waveform, the one's density bit stream spends equal amount of time at numerous point in between these two extremes, thereby generating a spread spectrum clock that varies evenly between the two frequency extremes and shaping the output frequency spectrum to a flat table top, as shown in FIG. 1(*a*). Noise from modulator 138 is filtered out by the PLL loop filter 148.

The parsing of the line length into a triangle spreading waveform in one embodiment of the present invention will now be described in detail. Other implementations of the line length parsing scheme can be used in other embodiments of the present invention. The exact way the line length is parsed into a spreading waveform is not critical to the practice of the present invention. It is only important that the spreading waveform is formed to match the line length so that the same clock spectrum spreading is applied to each line of the line imager device.

In the present embodiment, the line length L is broken down into segments so that each period of the triangle waveform has a number of clock cycles within a predefined range. For example, the line length L is broken down into segments so that each period of the triangle waveform has between 256 and 513 clock cycles. Each triangle waveform is characterized by two up ramps and two down ramps and zero padding. The generation of the spreading waveform for a given line length L is as follows.

First, the line length L is divided by two until the quotient (Q) is between the predefined clock cycle range, such as between 256 and 513. The number of divide-by-two divisions is Z and a wave counter value "A" is computed as $2^Z$ and stored in buffer 134. The remainder of the division is a value "B" which is also stored in buffer 134. Then, the two least significant bits of quotient Q is stored as a recurrent remainder value "C" in buffer 134. The remainder value "B" and the recurrent remainder value "C" will be used to determine the amount of zero padding used. Finally, the quotient Q is divided by 4 to give the clock cycles for each of the up and down ramps of the triangle waveform. Thus, a ramp length value "D" given as Q/4 is stored in buffer 134. Ramp length D specifies the number of clock cycles for each up and down ramps of the triangle waveform.

Each period of the triangle spreading waveform is formed by combining the up and down ramps and the zero padding as follows. An exemplary spreading waveform generated by the waveform generator in the line rate spread spectrum clock generator of the present invention is shown in FIG. 5. Referring to FIG. 5, starting at zero value, the spreading waveform is ramped up for D cycles and then ramp down for D cycles. Then zero padding from the recurrent remainder C is added, if any. More specifically, C−1 cycles of zero value are added. Thus, if C has a value of 3 or 2, then 2 or 1 cycle(s) of zero value will be added. If C has a value of 1, then no zero padding is added here but one cycle is added at the end of the waveform. Then, the spreading waveform is ramped down for D cycles and ramped up for D cycles. Then, zero padding of one cycle from the recurrent remainder is added if C is greater than 0. The two up ramps, two down ramps and the recurrent remainder form the basic triangle spreading waveform and the basic triangle spreading waveform is repeated A times. The frequency of the spreading waveform is thus determined by the number A representing how many spreading cycles to be used for the line. In addition, one cycle of zero padding is added to the first B number of waveforms to account for the remainder value B. As a result of the line length parsing, waveform generator 136 generates a spreading waveform that matches the line length exactly so that each line of the line imaging device experiences the same spreading profile.

As an example, assume that the line length L is 45980. It is divided 7 times to give a quotient Q of 359. Thus, the wave counter A is $2^7=128$. The remainder B is 28. The two least significant bits of quotient Q is C=3. Finally, the ramp length value D=359/4=89 (rounded off as remainder is accounted for in C already). Thus, for this line length, the spreading waveform is given as follows. The basic triangle spreading waveform is formed by 89 clock cycles of up ramp and 89 clock cycles of down ramp. Then, 2 cycles (C−1) of zero value. Then 89 cycles of down ramp and 89 cycles of up ramp. One cycle of zero value is added to complete the basic triangle spreading waveform. This basic triangle spreading waveform is repeated 128 times. For the first 28 waveforms, an additional cycle of zero value is added to the end of the waveform to account for the remainder B.

The above description provides one implementation of the line parse circuit and the waveform generator. In the present embodiment, the line length is broken down into sections where each section has a length within a given range and each section is formed into a triangle wave spreading waveform. Then, zero padding is added at the half-period and at the full-period of the triangle wave to account for residual line length values. In the present embodiment, the residual line length is distributed throughout the spreading waveform of the entire line so that there is no concentration of zero's at any location. A zero value of the spreading waveform represents the unmodulated clock frequency $f_0$. It is of course undesirable to allow the spreading waveform to remain at any frequency for an extended period of time as it would allow a spike in the power spectrum at that clock frequency to be formed. Therefore, in the present embodiment, the zero padding for the residual line length is distributed so as not to alter the spreading effect of the spreading waveform. Other methods to parse the line length into a spreading waveform can be used. The above description is illustrative only and is not intended to be limiting.

Returning to FIG. 3, by using the LRSSCG 130 of the present invention, the clock frequency for imaging timing used by the CCD sensor array 118 and the sampling timing used by the AFE circuit 120 is spread but the same spreading profile is applied to each line. The spreading waveform is linked to the line length so that the frequency of the clock will be identical at the beginning and the end of each line. Thus, each line experiences the same exposure time and the same sampling time occurring at the same place. While the spread spectrum clocking being used for imaging and sampling will introduce image effects in the form of imaging errors, the imaging errors become repeatable and occur at the same position and at the same magnitude so that the imaging errors can be readily corrected.

Figure 6A:
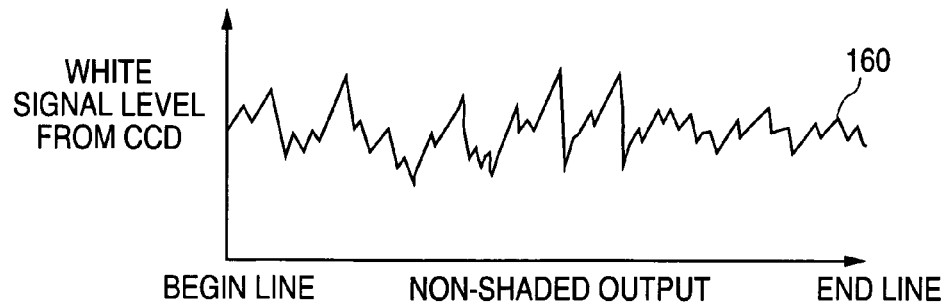
FIGS. 6(*a*) and 6(*b*) illustrate the pixel shading operation.
Figure 6B:
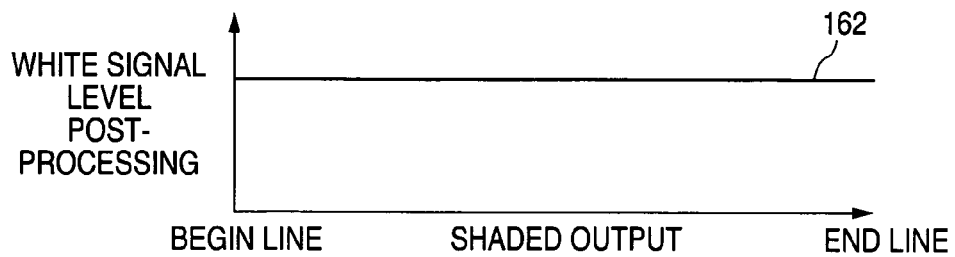

Modern imaging systems employ a practice called pixel shading to cancel out gain and offset errors in the imaging sensor array. CCD sensors or other imaging sensors typically have inherent pixel to pixel intensity variations. These pixel to pixel intensity variations are calibrated out digitally during image processing operations at the image processor integrated circuit. FIGS. 6(a) and 6(b) illustrate the pixel shading operation. FIG. 6(a) illustrates the pixel values 160 for a white level signal from a CCD sensor array. Due to different offset and gain values, the pixel values for the same white level have wide variations. However, when the offset and gain values are calibrated out for each pixel, an even white level signal is obtained for all pixel locations as shown in FIG. 6(b). When spread spectrum clocking is applied to the CCD sensor array, additional pixel intensity variations based on the spread spectrum clock is superimposed on top of the pixel values in FIG. 6(a). The additional pixel intensity variations cannot be corrected out easily in conventional systems because the pixel intensity variations occur at different locations from line to line.

Figure 7A:
FIGS. 7(*a*) and 7(*b*) illustrate the pixel shading operation when the clock spectrum is spread using the line rate spread spectrum clock generator according to one embodiment of the present invention.
Figure 7B:
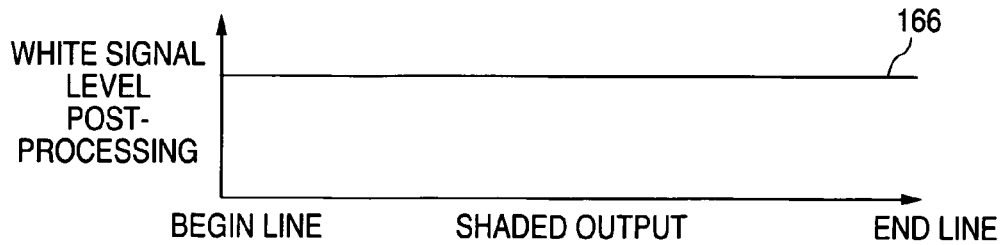

In accordance with the present invention, the imaging errors introduced by the spread spectrum clock are repeated as the clock spreading is linked to the line rate. Thus, the same imaging errors occur at the same location and the errors are the same line to line. FIG. 7(a) illustrates pixel values 164 for a white level signal from the CCD sensor array. In addition to the gain and offset errors that are inherently present, the pixel values 164 also include intensity variations due to the spread spectrum clock. However, in accordance with the present invention, the intensity variations due to the spread spectrum clock follow a predictable spread profile 165 and is the same from line to line. Thus, by applying the appropriate gain and offset calibration and taking into account variations due to the spreading profile, the image processor integrated circuit is able to obtain an even white level signal after processing of the pixel values, as shown in FIG. 7(b).

Mixed Domain Spread Spectrum Clocking

In line imaging device 100 of FIG. 3, spread spectrum clocking is applied to both the imaging/sampling timing and the data output timing, thereby optimizing EMI reduction. The spread spectrum clock is linked to the line rate of the imaging system so that image artifacts as a result of the spread spectrum clock can be readily removed/corrected.

In a line imaging system such as line imaging device 100, the analog circuitry on the small foot-print movable sensor bar actually does not generate significant EMI if the circuitry are properly shielded. The major source of EMI for the imaging system is in fact from the cable connecting the movable sensor bar to the image processor board.

According to one aspect of the present invention, a mixed domain spread spectrum clocking scheme is used in a line imaging device where spread spectrum clocking is used only for the data output clock driving the data output stream and other signals on the data cable. The image sensor timing and the sampling timing of the analog front end circuit use only unmodulated ("clean") clock signals. In this manner, spread spectrum clocking is applied to the major contributor of EMI—the data output cable—to reduce the EMI emission while the unmodulated clock is used for imaging and sampling and A/D conversion to preserve optimal image quality. As a result, the line imaging system can employ spread spectrum clocking to reduce EMI emission while maintaining optimized image quality.

In the present embodiment, the mixed domain spread spectrum clocking scheme is implemented in the analog front end (AFE) circuit of the line imaging system. As described above with reference to FIG. 3, the AFE circuit in housed in the movable sensor bar of the line imaging system and is configured to generate the imaging timing for the sensor array and the light source, to perform analog sampling and analog-to-digital conversion. In line imaging device 100, when mixed domain spread spectrum clocking scheme is used, AFE circuit 220 in FIG. 8 is used in place of AFE circuit 120 in FIG. 3.

Figure 8:
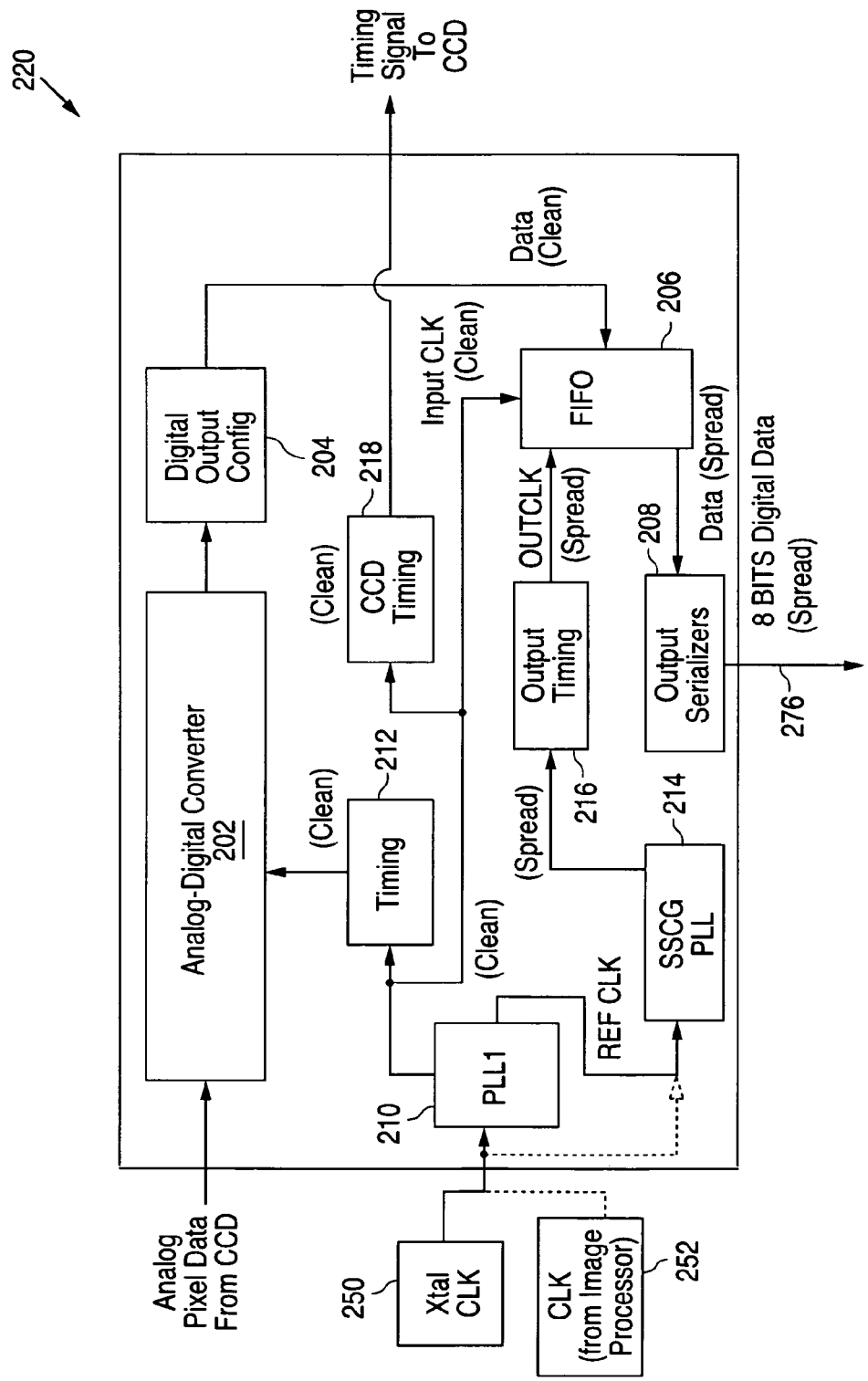
FIG. 8 is a block diagram of an analog front end circuit for a line imaging device implementing the mixed domain spread spectrum clocking scheme according to one embodiment of the present invention.

FIG. 8 is a block diagram of an analog front end circuit for a line imaging device implementing the mixed domain spread spectrum clocking scheme according to one embodiment of the present invention. Referring to FIG. 8, AFE circuit 220 includes an analog-to-digital converter 202 receiving the analog pixel data from the CCD sensor array and generating digital output data indicative of the analog pixel data. The digital output data is amplified and configured by digital output configuration circuit 204. AFE circuit 220 also receive a reference clock signal. The reference clock signal can be provided by a crystal oscillator 250 or the reference clock signal can be provided to the AFE circuit 220 from the image processor board via the cable. In the present embodiment, the reference clock is provided to a first phase-locked loop (PLL1) 210 and then the reference clock is passed through to a second phase-lock loop (SSCG PLL) 214. This configuration is illustrative only and in other embodiments, the reference clock from either the crystal oscillator or from the cable can be provided directly to both of the phase-locked loops.

AFE circuit 220 implements the mixed domain spread spectrum clocking scheme by using PLL1 210 for the clean (unmodulated) clock signal and SSCG PLL 214 for the spread spectrum (modulated) clock signal. In the present description, a "clean" clock signal refers to a clock signal that has not been modulated and thus has a clock frequency of $f_0$. Meanwhile, a spread spectrum clock has its clock frequency modulated within a given range: $f_0 \pm \gamma f$ over a spreading cycle. In AFE circuit 220, PLL1 210 is the phase-lock loop for generating the clean clock signal. The clean clock signal is provided to a timing circuit 212 to generate the sampling timing for the analog-to-digital converter 202 and the control timing for a first-in-first-out (FIFO) circuit 206. The clean clock signal is also provided to a CCD timing circuit 218 to generate the timing signals for the CCD sensor array. Accordingly, all clocks for the image capture operation (CCD timing, light source, analog sampling, ADC) are generated using PLL1 210 which provides a clock signal that is unmodulated and has no frequency variations. The captured analog pixel data do not suffer from image degradation effect due to spread spectrum and the digital data are generated based on the clean clock. The clean clock is coupled to FIFO 206 as the write clock to control the writing of the digital data into the FIFO.

In AFE circuit 220, SSCG PLL 214 is the phase-locked loop for generating the spread spectrum clock signal. The spread spectrum clock signal is provided to an output timing circuit 216 for generating the data output timing. The data output clock OUTCLK is coupled to FIFO 206 as the read clock to control the reading of the digital data out of the FIFO. The data read out of FIFO 206 are provided to output serializers 208 to be serialized and then transmitted onto a cable 276 as serial output data. Because the digital data are read out of FIFO 206 using the spread spectrum clock OUTCLK, the serialized digital output data on the data transmission path are spread so that EMI reduction is realized.

In the present embodiment, the digital data are transmitted on cable 276 as serial data using the serial peripheral interface (SPI). In other embodiments, the digital data can be transmitted using a parallel data interface and output serializers 208 is not necessary.

As thus configured, AFE circuit 220 operates in two clock domains—an unmodulated clock and a modulated clock. Because the spread clock at any given time may be faster or slower than the clean clock, FIFO 206 is used to arbitrate between the two clock domains. The FIFO depth increases for both higher spread percentage (range of spread frequencies) and lower spread rate (frequency of the modulation waveform or spreading waveform). The size of the FIFO selected can be optimized based on the desired EMI reduction as EMI reduction is maximized with the same change to the spread frequency range and the spread rate. In one embodiment, a 5% spread range is used and 1/512 of the reference clock is used as the spread rate. In that case, FIFO 206 requires only 13 states to arbitrate the two clock domains.

Figure 9A:
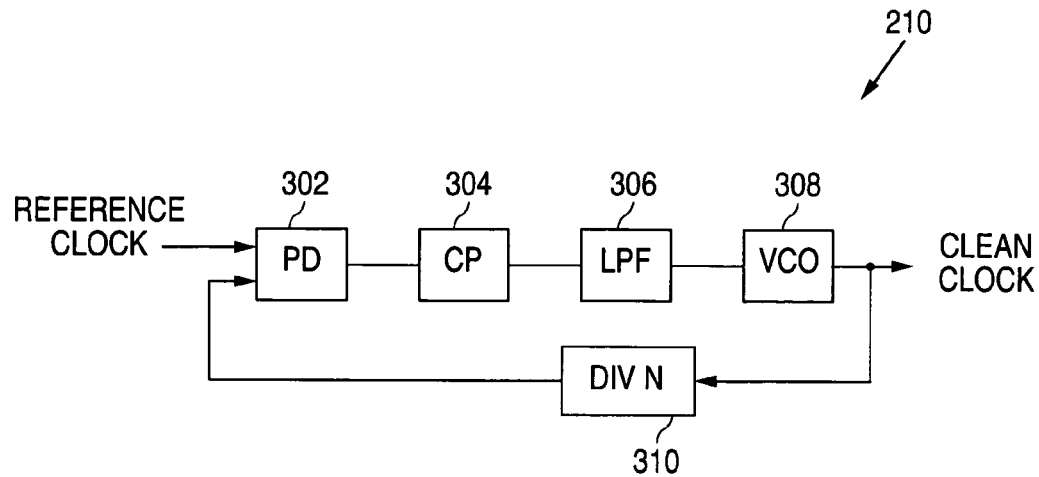
FIG. 9(*a*) illustrates a phase lock loop for generating an unmodulated clock and 9(*b*) illustrates a phase lock loop for generating a modulated clock according to one embodiment of the present invention.
Figure 9B:
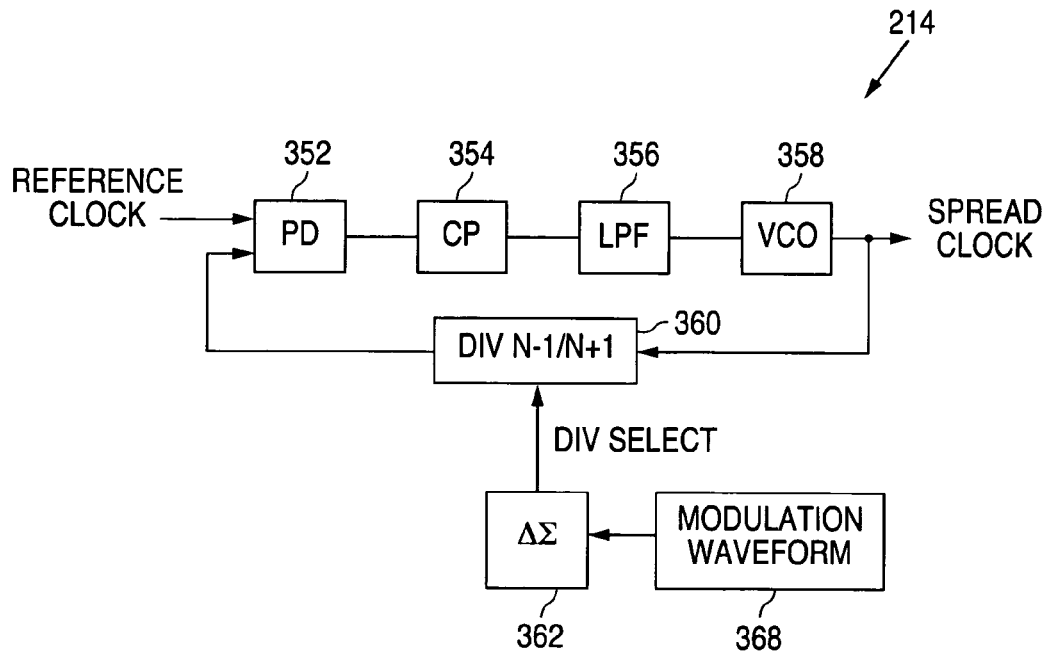

In the present embodiment, PLL1 210 for generating the clean, unmodulated clock is a fixed divide ratio PLL while SSCG PLL 214 for generating the spread spectrum clock is a modulated divide ratio PLL. FIGS. 9(a) and 9(b) illustrate the PLL architectures for generating the clean and modulated clocks.

For the imaging device to operate optimally over a very long period of time, the average frequency over all time of the spread spectrum clock must be identical to the frequency of the clean clock. This relationship can be achieved by using a modulated divide ratio PLL whose modulation waveform has a zero average value, and whose divide factor at zero average is identical to the divide factor of the clean clock generating PLL.

Referring to FIG. 9(a), PLL1 210 is configured as a conventional phase-locked loop including a phase detector 302, a charge pump 304, a low pass filter 306 and a voltage controlled oscillator 308. The clean clock is generated having a phase that matches the reference clock. The clean clock is fed back to a fixed divide ratio frequency divider 310 which divides the clean clock frequency by N for feed back to phase detector 302. Referring to FIG. 9(b), SSCG PLL 214 is configured as a conventional modulated divide ratio phase-locked loop including a phase detector 352, a charge pump 354, a low pass filter 356 and a voltage controlled oscillator 358. The spread clock is fed back to a modulated divide ratio frequency divider 360 whose divide ratio is selected by a divide ratio select (DIV Select) signal. The divide ratio select signal is generated by a sigma-delta modulator 362. Modulator 362 receives a modulation waveform 368 having the desired shape and generates a 1's density bit stream indicative of the modulation waveform. The modulation waveform is selected so that the divide ratio select signal is varied to select a divide ratio between N+1 and N−1 at divider 360.

In one embodiment, the fixed divide ratio for divider 310 is 42 (N=42). Thus, the unmodulated clock has a frequency of $f_{Ref} \times 42$, where $f_{Ref}$ is the frequency of the reference clock. For SSCG PLL 214, the divider ratio can be either 41 or 43 setting the spread clock frequency to a low of $f_{Ref} \times 41$ and a high of $f_{Ref} \times 43$. The divide ratio can also set to some arbitrary value between 41 and 43 through the action of the ΔΣ modulator 362. The modulator 362 generates an output which on average tracks the modulation (spreading) waveform. If the modulation waveform is ¼ of the way from min to max, then the divider select signal will select a divide ratio of 41.5. The modulation waveform 368 is generated digitally as a triangle wave whose average value over all time is 0. The triangle wave travels from +Max (indicating a divide ratio of 43) to −Max (indicating a divide ratio of 41). At the time average value of 0, the divide ratio is 42, the same as that used for the clean clock PLL. Now that the time average frequencies of the two PLL's are matched, the imaging device will not slip phase and a small FIFO can be used to arbitrate the two time domain without the need to reset the system timing. In order to make sure both PLL's 210 and 214 and the FIFO will operate properly, the FIFO initial register values are maintained until both PLLs are locked.

When AFE circuit 220 of FIG. 8 is substituted for the AFE circuit 120 of FIG. 3, all the signals that are transmitted on the cable 116 are spread to reduce EMI. It is also possible to eliminate transmitting the clock signal from the image processor board to the moveable sensor bar by using a crystal oscillator to generate the reference clock locally. Meanwhile, the analog subsystem timings on the movable sensor bar are operated using an unmodulated clock. Therefore, optimal imaging and AFE performance can be maintained.

Multi-Spread Spectrum Clocking Scheme

In AFE circuit 220, two clock domains are used where one clock domain uses an unmodulated clock and the other clock domain uses a modulated clock. In this manner, EMI reduction and image quality are both optimized. In some applications, applying spread spectrum clocking only to the output data timing may not be sufficient to reduce the EMI to an acceptable level. In that case, it would be desirable to spread the imaging/sampling timing as well while avoiding undesirable image degradation.

According to another aspect of the present invention, a modified mixed domain spread spectrum clocking scheme is used in a line imaging device where a first spread spectrum clock is used to drive the imaging timing and the sampling timing and a second spread spectrum clock is used only for the data output clock driving the data output stream and other signals on the data cable. More specifically, the first spread spectrum clock has a narrower spectrum to limit image degradation while providing some degree of EMI reduction. The second spread spectrum clock has a broader spectrum as the data output signals can tolerate clock frequency variations with negative effects.

Figure 10:
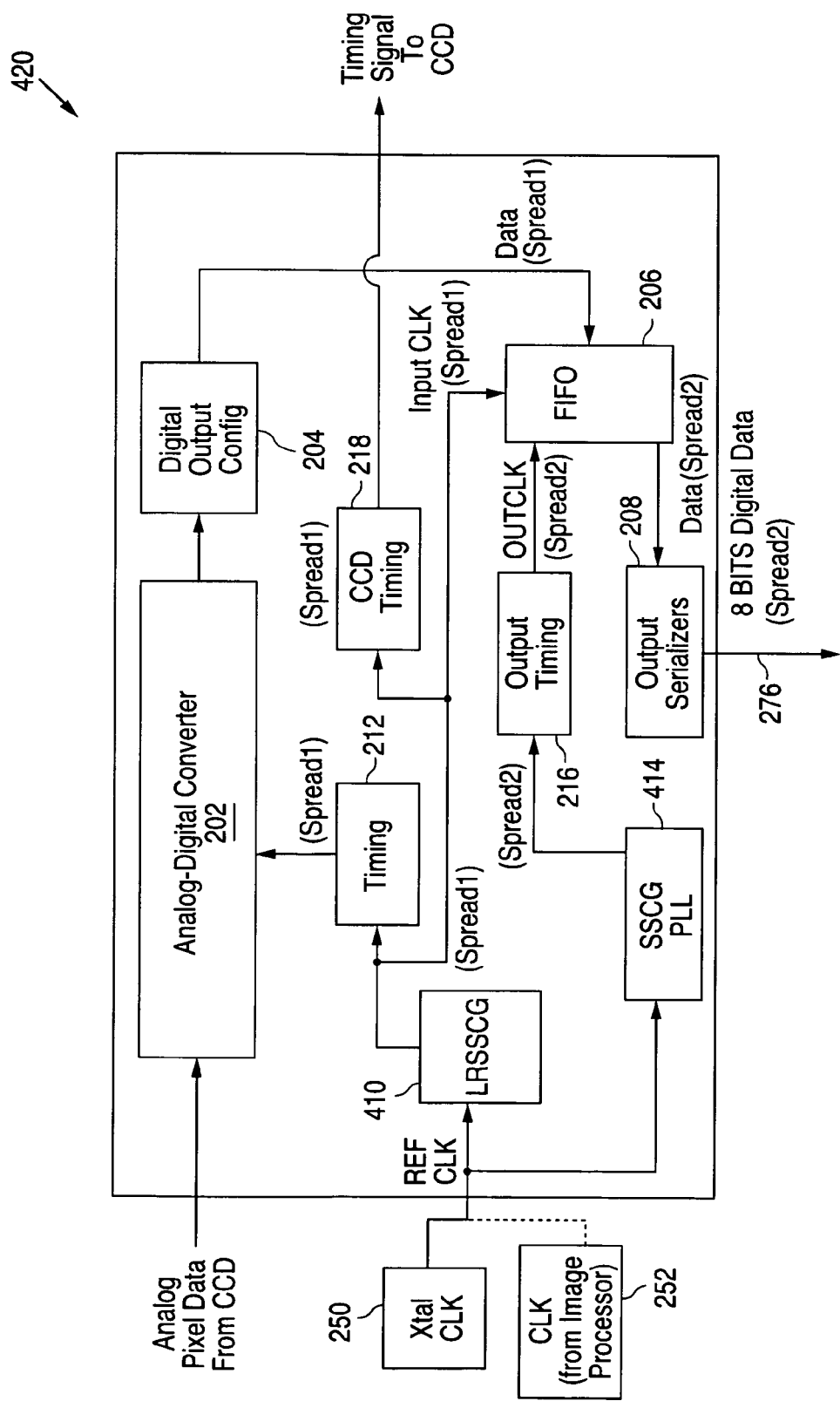
FIG. 10 is a block diagram of an analog front end circuit for a line imaging device implementing the modified mixed domain spread spectrum clocking scheme according to one embodiment of the present invention.

FIG. 10 is a block diagram of an analog front end circuit for a line imaging device implementing the modified mixed domain spread spectrum clocking scheme according to one embodiment of the present invention. Referring to FIG. 10, AFE circuit 420 is configured in the same manner as AFE circuit 220 of FIG. 8 except for the phase-locked loops. Therefore, detail construction of AFE circuit 420 will not be further described. In AFE circuit 420, a first phase-locked loop 410 is a modulated divide ratio phase-locked loop generating a first spread clock signal for the sampling and image timing signals. The second phase-locked loop 414 is a modulated divide ratio phase-locked loop generating a second spread clock signal for the data output transmissions. Both of the first PLL 410 and second PLL 414 can be implemented using the construction of FIG. 9(b). Furthermore, in one embodiment, first PLL 410 is implemented using the line rate spread spectrum clock generator of FIG. 4 so that the first spread clock is synchronous to the line rate of the line imaging device. In this manner, the image quality of the line imaging device is preserved while optimized EMI reduction is obtained.

The modulated divider ratio for the first PLL 410 has a narrower range than the modulated divider ratio for the second PLL 414. Therefore, the first PLL 410, providing the timing signals for imaging and sampling, generates a first spread clock signal that has a limited frequency variation range. The second PLL 414, providing the timing signals for data output, generates a second spread clock signal that has a wider frequency variation range to further reduce the EMI emission.

The above detailed descriptions are provided to illustrate specific embodiments of the present invention and are not intended to be limiting. Numerous modifications and variations within the scope of the present invention are possible. The present invention is defined by the appended claims.

I claim:

1. A method of generating a spread spectrum clock signal for a line imaging device, comprising:
   receiving a line length value of the line imaging device;
   receiving a first clock signal indicative of a system timing signal in the line imaging device;
   generating a spreading waveform having a frequency as a function of the line length value and having a total number of clock cycles matching the line length value; and
   modulating the first clock signal using said spreading waveform to generate the spread spectrum clock signal, the spread spectrum clock signal being used for driving the imaging, data sampling and digitizing, and data transfer operation of the line imaging device, the spread spectrum clock having the same clock frequency variation for each scan line of the line imaging device.

2. The method of claim 1, wherein generating a spreading waveform having a frequency as a function of the line length value and having a total number of clock cycles matching the line length value comprises:
   parsing the line length value into a plurality of waveform parameters, the waveform parameters including a first number having a value within a predetermined range and indicative of the number of clock cycles for forming one spreading cycle being one period of the spreading waveform and a second number indicative of the number of spreading cycles in the spreading waveform;
   introducing zero cycles to each spreading cycle when needed to cause the total number of clock cycles of the spreading waveform to match the line length value; and
   generating the spreading waveform by repeating the spreading cycle for the second number of times, the first number determining the frequency of the spreading waveform.

3. The method of claim 2, wherein modulating the first clock signal using said spreading waveform to generate the spread spectrum clock signal comprises:
   providing the first clock signal to a phase-locked loop, the phase-locked loop comprising a feedback frequency divider in a feedback path;
   generating a selection bit signal based on the spreading waveform, the selection bit signal being a 1's density bit stream having an average value indicative of the spreading waveform; and
   modulating a frequency divider ratio of the feedback frequency divider using the selection bit signal, thereby modulating the frequency of the first clock signal to generate the spread spectrum clock signal.

4. The method of claim 2, wherein generating the spreading waveform by repeating the spreading cycle for the second number of times comprises:
   generating a triangle waveform as the spreading waveform, the triangle waveform including triangle waves each wave being formed using the first number of clock cycles;
   introducing zero cycles at the half period and at the full period of each triangle wave when needed to match the total number of clock cycles of the triangle waveform to the line length value; and
   repeating each triangle wave including the zero cycles for the second number of times to form the spreading waveform.

5. The method of claim 2, wherein parsing the line length value into a plurality of waveform parameters and introducing zero cycles to each spreading cycle comprises:
   dividing by the line length value until the quotient is between a predefined range, the quotient being the first number;
   counting the number of divisions as the second number;
   setting the remainder of the division as a third number being a waveform parameter;
   setting P number of least significant bits of the first number as a fourth number being a waveform parameter;
   adding (fourth number minus one) number of zero cycles at the half period of each spreading cycle;
   adding a zero cycle at the full period of each spreading cycle for the third number of times; and
   adding a zero cycle at the full period of each spreading cycle when the fourth number is greater than zero.

6. The method of claim 1, further comprising:
   correcting errors in digital data signals generated by the line imaging device based on the spreading waveform.

7. A line rate spread spectrum clock generator (130) for a line imaging device (100) comprising:
   a line length parse circuit (132) for receiving a line length value of the line imaging device and parsing the line length value into a plurality of waveform parameters;
   a waveform generator (136) coupled to receive the waveform parameters and configured to generate a spreading waveform having a frequency that is a function of the line length value and having a total number of clock cycles matching the line length value;
   a modulator circuit (138) for generating a selection bit signal being a 1's density bit stream having an average value indicative of the spreading waveform; and
   a phase locked loop (140) receiving a first clock signal indicative of the system timing signals in the line imaging device and the selection bit signal, the selection bit signal modulating a feedback frequency divider ratio of the phase locked loop to generate a spread spectrum clock, the spread spectrum clock signal being used for driving the imaging, data sampling and digitizing, and data transfer operation of the line imaging device, the spread spectrum clock having the same clock frequency variation for each scan line of the line imaging device.

8. The line rate spread spectrum clock generator of claim 7, wherein the line length parse circuit is operative to parse the line length value into a first number having a value within a predetermined range and indicative of the number of clock cycles for forming one spreading cycle being one period of the spreading waveform, the first number determining the frequency of the spreading waveform, a second number indicative of the number of spreading cycles in the spreading waveform, and one or more waveform parameters for defining the number of zero cycles to be introduced to the half period or the full period of each spreading cycle to cause the total number of clock cycles of the spreading waveform to match the line length value.

9. The line rate spread spectrum clock generator of claim 8, wherein the line length parse circuit is further operative to parse the line length into a third number indicative of the number of times a zero cycle is to be introduced at the full period of each spreading cycle; and a fourth number indicative of the number of zero cycles to be introduced at the half period and the full period of each spreading cycle, the number of zero cycles being added to cause the total number of clock cycles of the spreading waveform to match the line length value.

10. The line rate spread spectrum clock generator of claim 8, wherein the waveform generator generates a triangle waveform as the spreading waveform, the triangle waveform including triangle waves each being formed using the first number of clock cycles, the triangle waves being repeated the second number of times to form the spreading waveform.

11. The line rate spread spectrum clock generator of claim 10, wherein the waveform generator introduces zero cycles based on the waveform parameters at the half period and at the full period of each triangle wave when needed to match the total number of clock cycles of the triangle waveform to the line length value and repeats each triangle wave, including the zero cycles, for the second number of times to form the spreading waveform.

12. The line rate spread spectrum clock generator of claim 7, further comprising an image processor (124) for correcting errors in digital data signals generated by the line imaging device based on the spreading waveform.

* * * * *